(12) United States Patent
Honda

(10) Patent No.: US 7,138,064 B2
(45) Date of Patent: Nov. 21, 2006

(54) SEMICONDUCTOR DEVICE AND METHOD OF MANUFACTURING THE SAME

(75) Inventor: Hirokazu Honda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 290 days.

(21) Appl. No.: 10/365,833

(22) Filed: Feb. 13, 2003

(65) Prior Publication Data

US 2003/0157810 A1     Aug. 21, 2003

(30) Foreign Application Priority Data

Feb. 15, 2002   (JP)   ............... 2002-038442
Nov. 28, 2002   (JP)   ............... 2002-346349

(51) Int. Cl.
*H01B 13/00* (2006.01)
(52) U.S. Cl. ............... 216/13; 216/14; 216/18; 216/102; 216/105
(58) Field of Classification Search ............... 216/13, 216/14, 18, 83, 95, 102; 29/829, 846
See application file for complete search history.

(56) References Cited

U.S. PATENT DOCUMENTS 5,534,466 A * 7/1996 Perfecto et al. ............... 216/20
6,036,809 A * 3/2000 Kelly et al. ............... 156/247
6,803,324 B1 * 10/2004 Ogawa et al. ............... 438/761
2003/0157783 A1 * 8/2003 Fonash et al. ............... 438/458

FOREIGN PATENT DOCUMENTS

| JP | 8-167629 | 6/1996 |
| JP | 10-178271 A | 6/1998 |
| JP | 2000-31317 | 1/2000 |
| JP | 2001-177010 | 6/2001 |
| JP | 2001-257288 | 9/2001 |

OTHER PUBLICATIONS

Wolf et al., Silicon Processing for the VLSI Era, 1986, Lattice Press, vol. 1, pp. 523, 531-534.*
Wolf et al., Silicon Processing for the VLSI Era, 1986, Lattice Press, vol. 1, pp. 520-521.*

* cited by examiner

*Primary Examiner*—Lan Vinh
(74) *Attorney, Agent, or Firm*—Muirhead & Saturnelli, LLC

(57) ABSTRACT

The present invention relates to a method of manufacturing a semiconductor device. In the method, an etching-back layer consisting of aluminum or copper is formed on a base substrate and a multilayer wiring board is manufactured on the etching-back layer. After that, the etching-back layer is etched to be removed under the condition that the multilayer wiring board and the base substrate are not etched, so that the base substrate is separated from the multilayer wiring board. Accordingly, the base substrate can be reused.

19 Claims, 14 Drawing Sheets

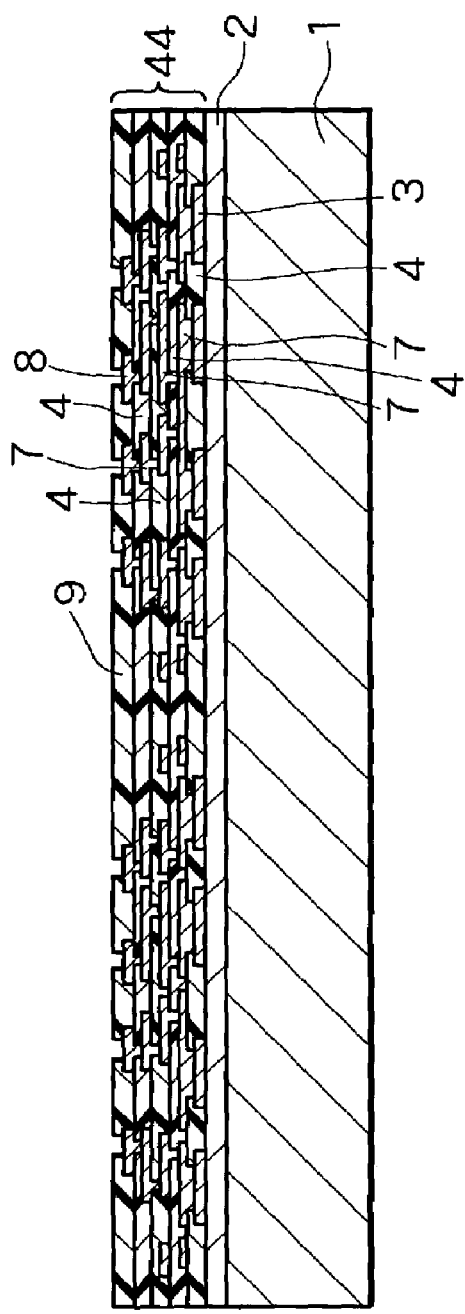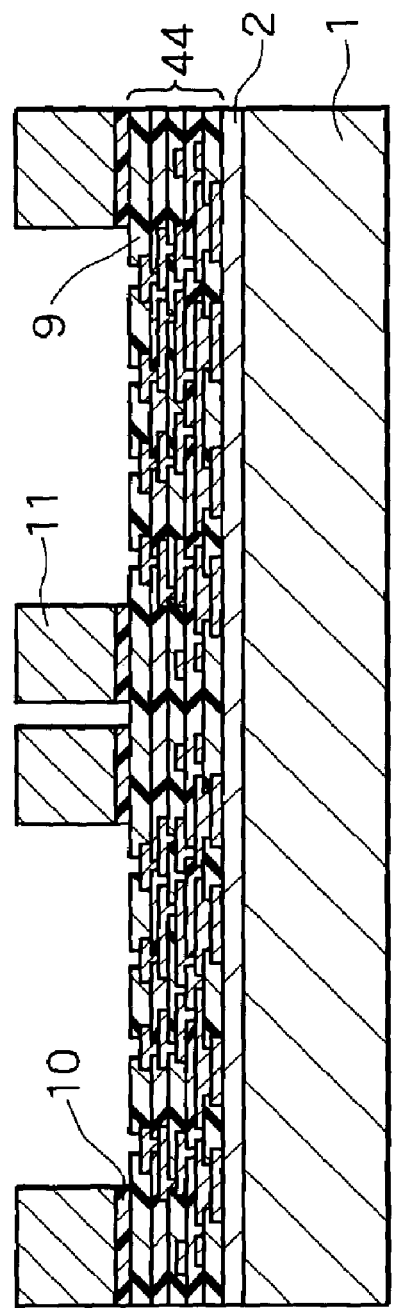
FIG. 4A
FIG. 4B

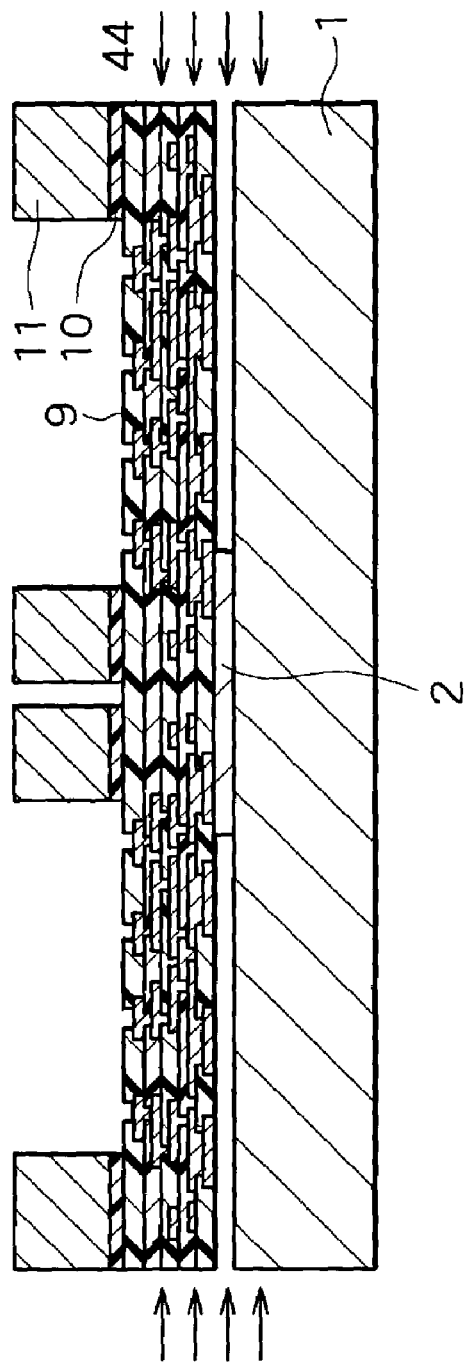
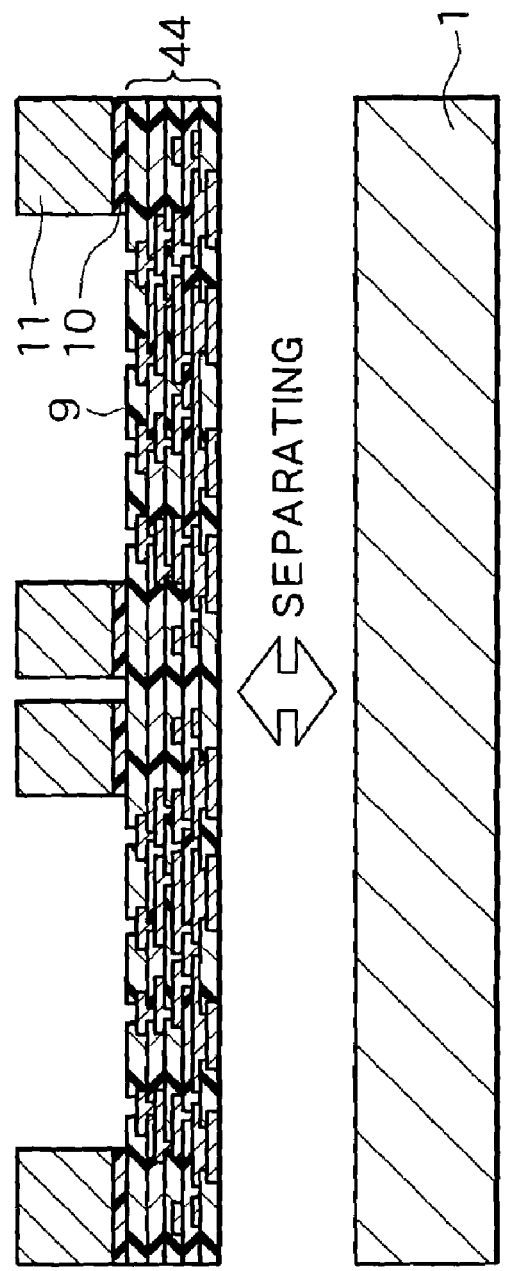

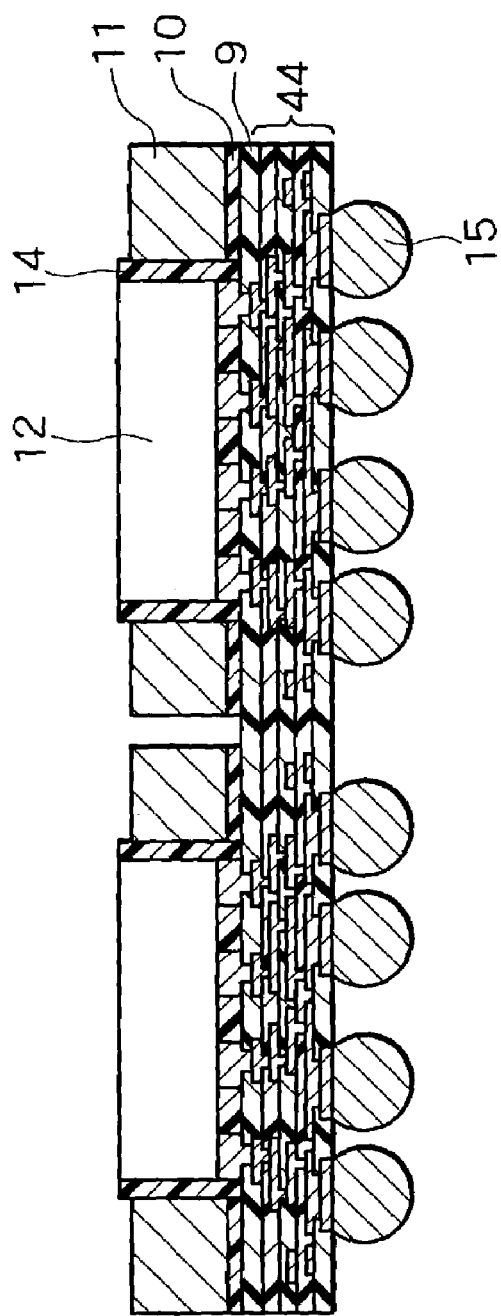
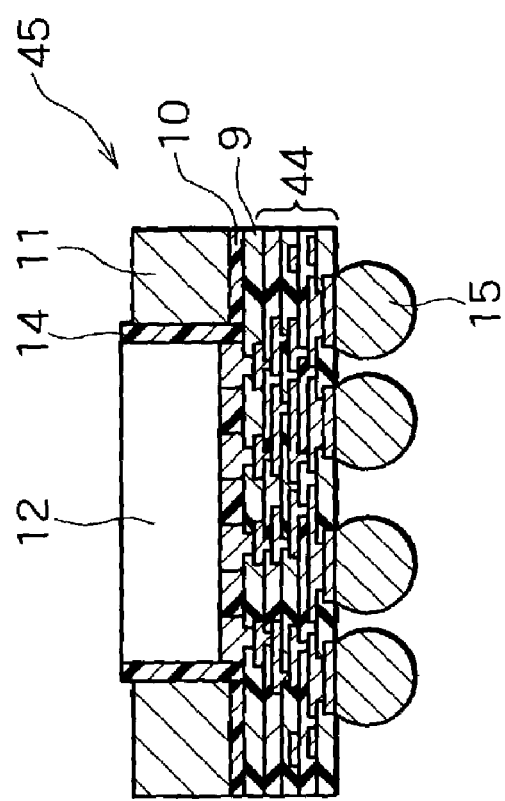
FIG. 5C
FIG. 5D

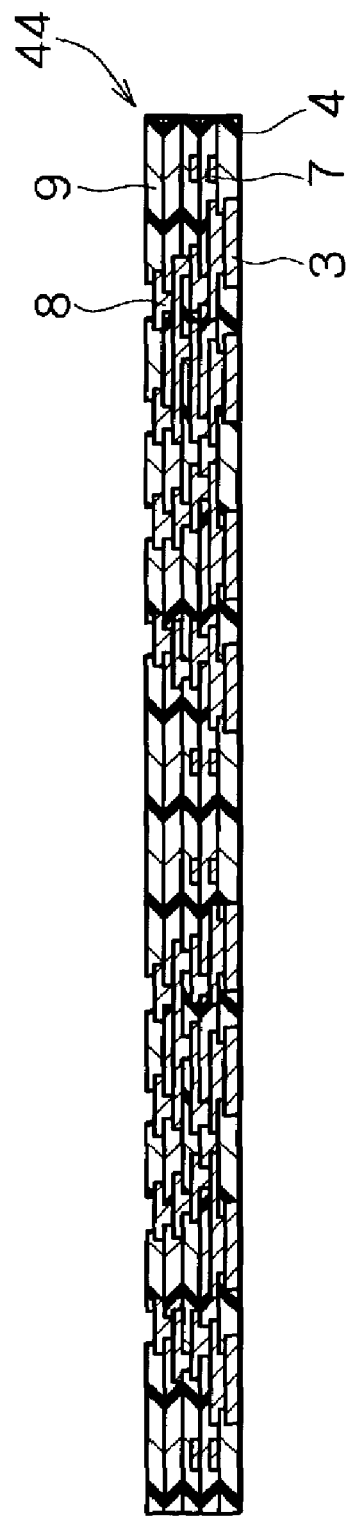
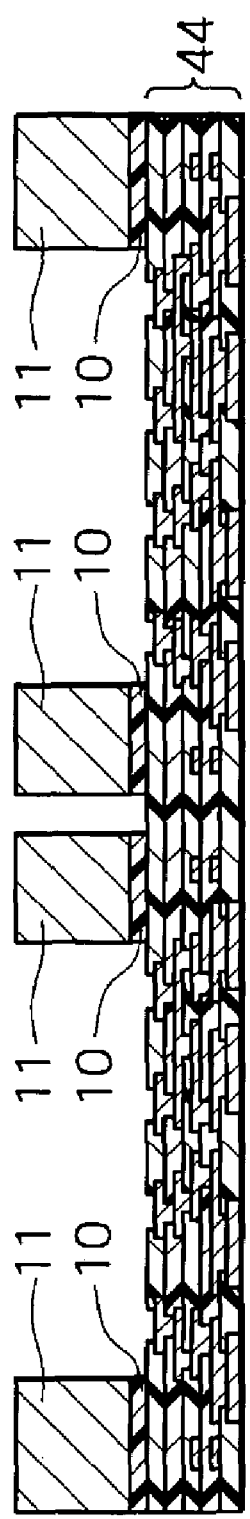

SEMICONDUCTOR DEVICE AND METHOD OF MANUFACTURING THE SAME

BACKGROUND OF THE INVENTION

1. Field of the Invention

The present invention relates to a semiconductor device whose manufacturing cost was reduced and method of manufacturing the same, and particularly relates to a flip-chip type semiconductor device in which a semiconductor chip was mounted on a multilayer wiring board and method of manufacturing the same.

2. Description of the Related Art

As disclosed in Japanese Patent Publication Laid-open No. 2001-257288, in accordance with the demands of weight reduction in a semiconductor device and a reduction of a mounting area, semiconductor devices, particularly flip-chip type semiconductor devices, which are assembled by a bare chip mounting process have been noted.

FIG. 1 is a cross-sectional view showing a conventional flip-chip type semiconductor device. As shown in FIG. 1, in the conventional flip-chip type semiconductor device 318, an insulating substrate 311 is provided. And a conductive adhesive 313 is provided in the insulating substrate 311. Further, a multilayer wiring board 309 is provided on the front surface of the insulating substrate 311, and bumps 317 are provided on the back surface of the insulating substrate 311. The multilayer wiring board 309 and the bumps 317 are connected to each other with conductive adhesive 313. Further a semiconductor chip 314 is mounted on the surface of the multilayer wiring board 309, and the semiconductor chip 314 is covered with an insulating resin 316 to be supported and protected by the resin 316. The flip-chip type semiconductor device 318 is mounted on a substrate (not shown) through the bumps 317. The bumps 317 and the semiconductor chip 314 are electrically connected to each other with the multilayer wiring board 309 and the conductive adhesive 313 formed in the insulating substrate 311.

An excellent flatness is required for the multilayer wiring board 309. Therefore, the multilayer wiring board 309 is manufactured by the following steps. First, a supporting substrate (not shown), having high rigidity and being composed of metal such as copper (Cu), nickel (Ni), aluminum (Al) and the like, or an alloy-consisting of them as primary components, is prepared. Next, the multilayer wiring board 309 is formed on the supporting substrate. And, the supporting substrate is removed by etching so that only the multilayer wiring board 309 is left.

However, the above-described conventional arts have the following problems. That is, as mentioned above, the supporting substrate having the excellent rigidity is removed by etching after the multilayer wiring board has been once formed. Accordingly, when the next multilayer wiring board is formed, a new supporting substrate must be prepared, which results in increased cost.

SUMMARY OF THE INVENTION

An Object of the present invention is to provide a flip-chip semiconductor device whose manufacturing cost is reduced by reusing a supporting substrate having high rigidity when a multilayer wiring board is formed, and the method of manufacturing a semiconductor device.

A method of manufacturing a semiconductor device according to the present invention has the step of forming an etching-back layer formed of a second material on a supporting substrate formed of a first material. The second material is different in etching rate from the first material. Further, the method of manufacturing according to the present invention a semiconductor device has the steps of forming a multilayer wiring board on the etching-back layer, etching the etching-back layer to separate the supporting substrate from the multilayer wiring board, and mounting a semiconductor chip on the multilayer wiring board.

In the present invention, after the etching-back layer and the multilayer wiring board were formed on the supporting substrate, the etching-back layer is etched to remove the supporting substrate from the multilayer wiring board. Accordingly, the semiconductor chip is mounted on the multilayer wiring board to manufacture a semiconductor device, and also the supporting substrate is removed so that it can be reused. As a result, the manufacturing cost of the semiconductor device can be reduced.

Another method of manufacturing a semiconductor device has the step of forming an etching-back layer formed of a second material on a supporting substrate formed of a first material. The second material is different in etching rate from the first material. The method of manufacturing a semiconductor device according to the present invention has the steps of forming a multilayer wiring board on the etching-back layer, etching the etching-back layer to separate the supporting substrate from the multilayer wiring board, mounting a plurality of semiconductor chips on the multilayer wiring board, and separating the multilayer wiring board every the semiconductor chip.

A semiconductor device according to the present invention has a multilayer wiring board and a semiconductor chip mounted on the multilayer wiring board. The semiconductor chip is mounted on the multilayer wiring board. The multilayer wiring board is separated from a supporting substrate by etching an etching-back layer. The etching-back layer is formed between the multilayer wiring board and the supporting substrate. Accordingly, the present invention can provide inexpensive semiconductor devices.

As described above, according to the present invention, after the multilayer wiring board was formed on a supporting substrate through an etching-back layer, the etching-back layer was etched so that the supporting substrate can be removed from the multilayer wiring board. As a result the supporting substrate can be reused and a material cost in the manufacturing cost of a semiconductor device can be significantly decreased. Thus, the cost of the semiconductor manufactured by the use of the multilayer wiring board can be reduced.

BRIEF DESCRIPTION OF THE DRAWINGS

FIGS. 4A to 4D are cross-sectional views showing a method of manufacturing the semiconductor device according to the present embodiment in the order of the steps, showing the next step of FIG. 3F;

FIGS. 5A to 5D are cross-sectional views showing a method of manufacturing the semiconductor device according to the present embodiment in the order of the steps, showing the next step of FIG. 4D;

FIGS. 11A and 11B are cross-sectional views showing a method of manufacturing a semiconductor device according to a fifth embodiment of the present invention in the order of the steps.

DETAILED DESCRIPTION OF THE PREFERRED EMBODIMENTS

Embodiments of the present invention will now be described in detail with reference to attached drawings. First, a first embodiment of the present invention will be described. FIGS. 2A to 2G, FIGS. 3A to 3F, FIGS. 4A to 4D, and FIGS. 5A to 5D are cross-sectional views showing a method of manufacturing a semiconductor device according to the present embodiment.

Figure 1:
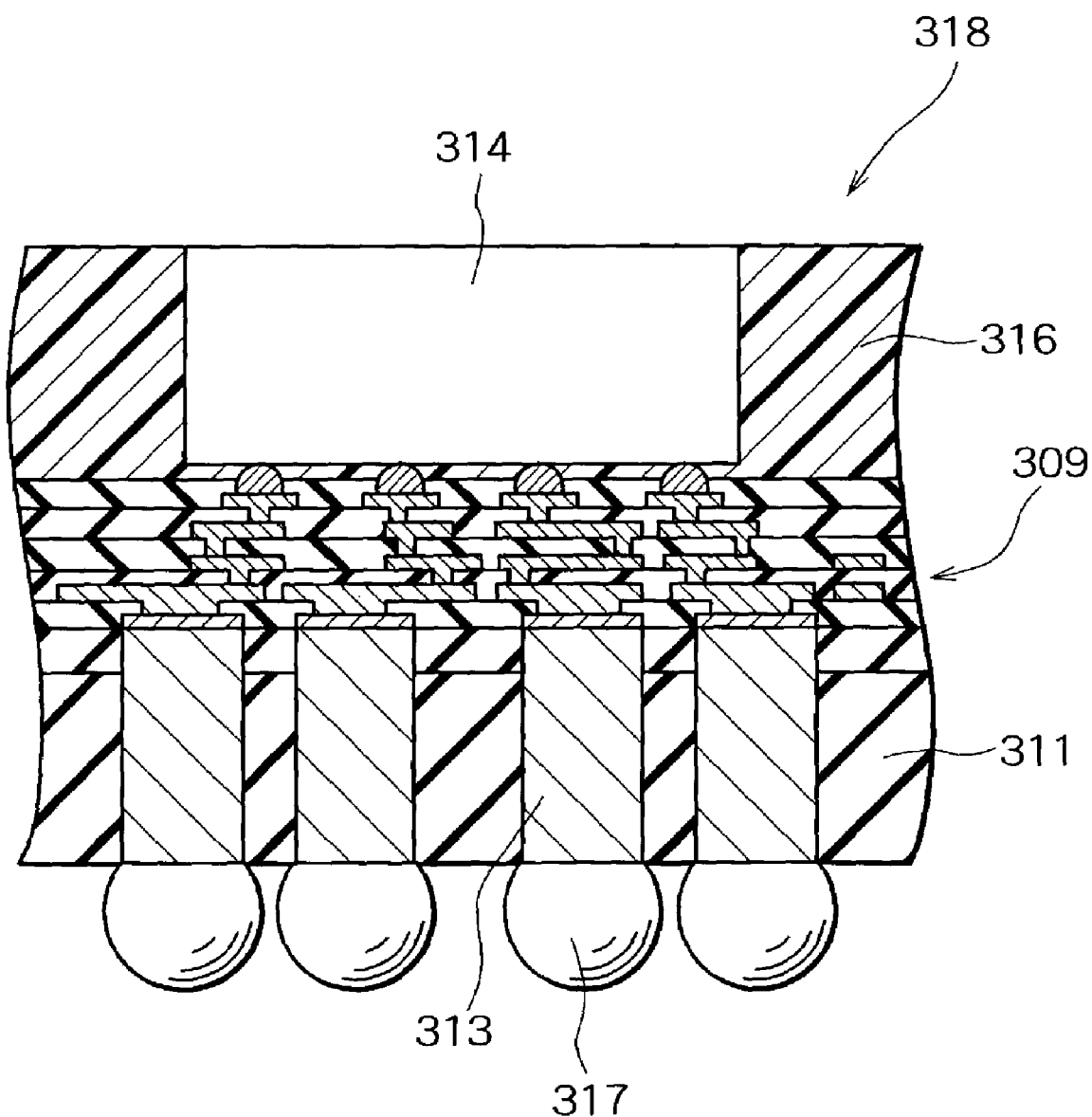
FIG. 1 is a cross-sectional view showing a conventional flip-chip type semiconductor device.
Figure 2A:
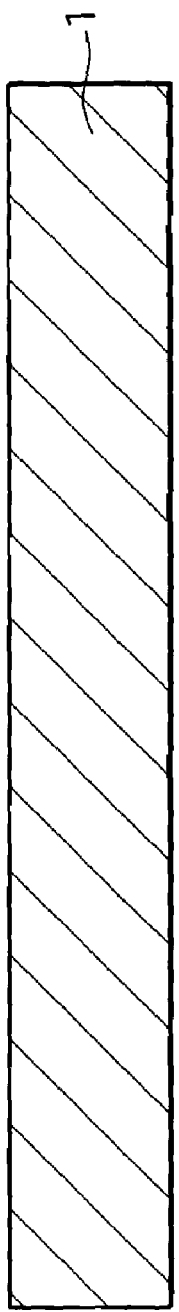
FIGS. 2A to 2G are cross-sectional views showing the method of manufacturing a semiconductor device according to a first embodiment of the present invention in the order of the steps.

First, as shown in FIG. 2A, a base substrate 1 having high surface flatness and high mechanical strength is prepared. A material forming this base substrate 1 is a material having an elastic modulus of, for example, 20 GPa or more, and more preferably 100 GPa or more at room temperature. The materials of the base substrate 1 are for example, metals or alloy materials such as Si, Ti alloys, stainless steels (SUS), duralumin, maraging steel and the like, or inorganic ceramic materials such as alumina. mullite, aluminum nitride, and the like, or organic materials having excellent surface flatness and heat-resisting properties such as polyimide and the like.

Figure 2B:
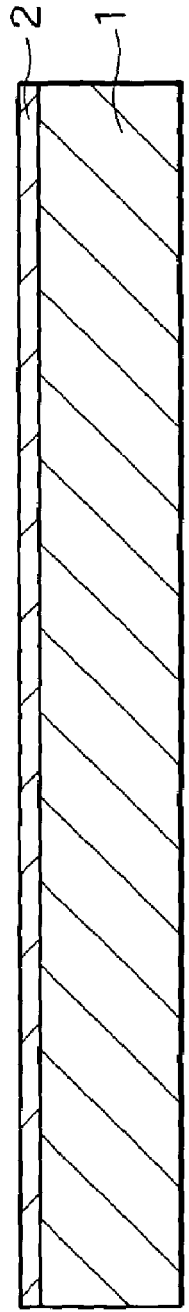

Then, as shown in FIG. 2B, an etching-back layer 2, which consists of Al or Cu as the principal component, is formed on the entire surface of the base substrate 1 by a sputtering method or the like. It is noted that the etching-back layer 2 may be formed of an aluminum alloy or cupper alloy.

Figure 2C:
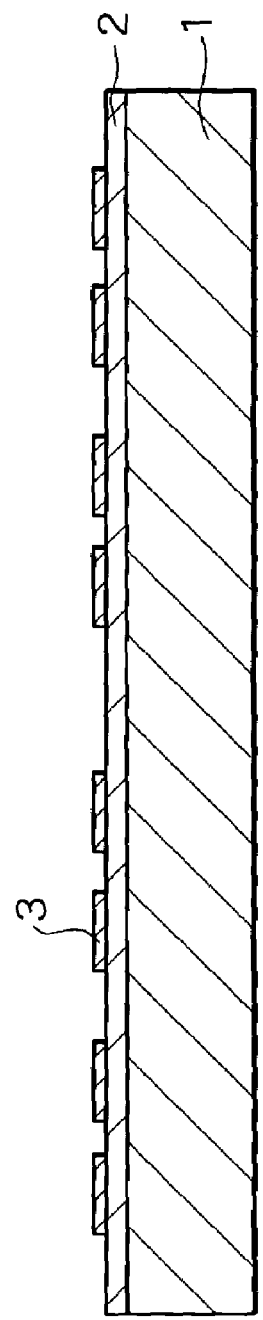

Then, as shown in FIG. 2C, external electrode pads 3 are formed on the etching-back layer 2. At this time, when the etching-back layer 2 is formed of a material consisting of Al as the principal component, the external electrode pads 3 is formed by the following steps. That is, first, a photoresist (not shown) is formed on the etching-back layer 2. Then, the photoresist is subjected to exposure and development processes and patterned so that a predetermined areas to form a pattern of the external electrode pads 3 are exposed. After that, a plating film of a three-layer film in which a Zn layer, Ni layer and Cu layer were laminated in this order (hereinafter referred to as Zn/Ni/Cu layer) by an electrolessly plating technique, is formed on openings of the photoresist that is exposed portions in the etching-back layer 2 to form an external electrode pads 3. In this case, the thickness of each layer in the Zn/Ni/Cu layers is 0.1 to 1 µm in the Zn layer, 1 to 10 µm in the Ni layer, and 10 to 50 µm in the Cu layer. Accordingly, the total thickness of the external electrode pad 3 is in the range of 11.1 to 61 µm. After the external electrode pads 3 were formed, the photoresist is removed.

It is noted that at this time, to enhance the adhesion properties between Al etching-back layer 2 and the external electrode pad 3 the external electrode pad 3 may be formed by the following process. That is, a thin intermediate layer (not shown) of a Ti/Cu layer, a Cr/Cu layer or a Cu alloy single layer is formed by a sputtering process or the like on the Al etching-back layer 2. The thickness of the intermediate layer is set to about for example 0.2 to 2 µm. After that a photoresist is formed on this intermediate layer and exposure and development processes are performed to pattern it, whereby openings are provided at predetermined areas where external electrode pads 3 will be formed. Then by using the Cu layer (Cu alloy layer) in the above-described Ti/Cu layer, Cr/Cu alloy layer or a Cu alloy layer as an electrical supply layer, an Au/Ni/Cu composite plated layer is formed as external electrode pads 3 while using the electrolytic plating technique. In this case, the thickness of the Au layer is 0.3 to 3 µm, the thickness of the Ni layer is 1 to 10 µm and the thickness of the Cu layer is 10 to 50 µm. Thus, the total thickness of the Au/Ni/Cu layer reaches 11.3 to 63 µm.

Subsequently, the photoresist is removed. After that the area, which is not covered with the external electrode pads 3 in the intermediate layer is removed by a chemical etching process, or a dry etching technique such as an ion beam etching process or the like.

On the other hand, when the etching-back layer 2 is formed of a material consisting of Cu as the principal component, external electrode pads 3 are formed by the following steps. That is, on the etching-back layer 2 formed on the base substrate 1, a photoresist (not shown) is formed. Then, the photoresist is subjected to exposure and development processes and patterned so that a predetermined areas to form external electrode pads 3 in the etching-back layer 2 are exposed. That is the pattern of the photoresist is formed so as to have a pattern obtained by inverting the pattern of the external electrode pads 3.

After that the Cu layer as the etching-back layer 2 is used as an electrical supply layer and Au/Ni/Cu composite plated layer is formed as the external electrode pads 3 using the electrolytic plating technique. Then, the photoresist is removed. At this time in the Au/Ni/Cu composite plated layer, the thickness of the Au layer is 0.3 to 3 µm, the thickness of the Ni layer is 1 to 10 µm and the thickness of the Cu layer is 10 to 50 µm. Thus, the total thickness of the Au/Ni/Cu composite plated layer reaches 11.3 to 63 µm.

Figure 2D:
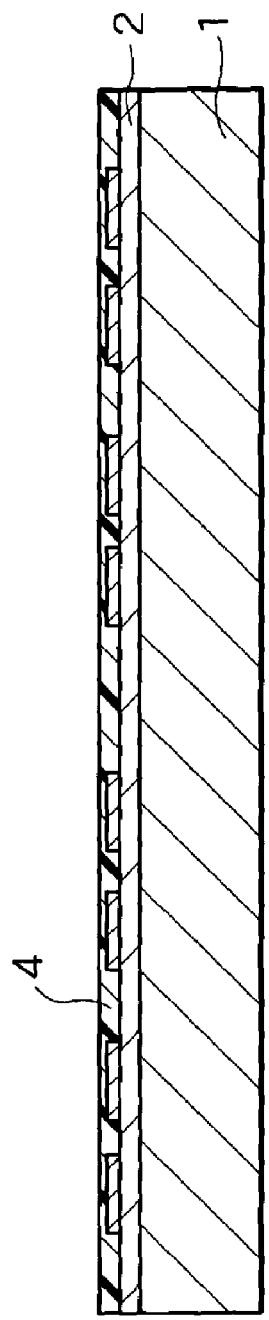

Then, as shown in FIG. 2D, an insulating layer 4 is formed on the etching-back layer 2 in such a manner that the insulating layer 4 covers the external electrode pads 3. The insulating layer 4 can be formed by a spin coating process using a liquid organic insulating material such as a polyimide resin or an epoxy resin or the like, or can be formed by depositing an inorganic insulating material such as SiO groups or the like by use of a CVD (Chemical Vapor Deposition) process or a PVD (Physical Vapor Deposition) process using a plasma surface treatment technique. It is noted that the insulating layer 4 is preferably formed by using one or two or more resins selected from a group consisting of epoxy resins, silicone resins, polyimide resins, polyolefin resins, cyanate ester resins, phenol resins, and naphthalene resins as the principal component. In this case, the thickness of a portion corresponding to the area just above the external electrode pads 3 in the insulating layer 4 may be about for example 20 to 80 µm.

Figure 2E:
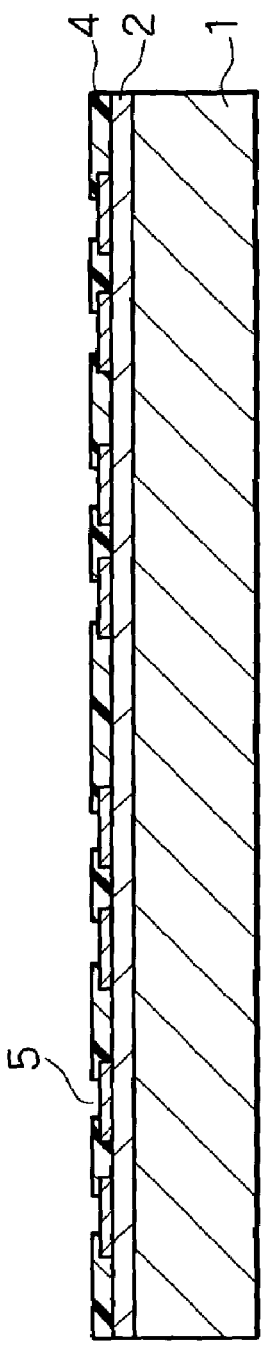

Then, as shown in FIG. 2E, the insulating layer 4 on the external electrode pads 3 is partially removed to form openings 5. That is a photoresist (not shown) is formed on the entire surface of the insulating layer 4, and this photoresist is subjected to exposure and development processes to pattern the photoresist so that openings are formed on a predetermined area to form openings 5, that is parts of the area just above the external electrode pads 3. After that, the insulating layer 4 is patterned by using the patterned photoresist as a mask. Then, in a case where the insulating layer 4 is formed of a material which can be chemically etched, for example polyimide which can be etched with sodium hydroxide (NaOH) or the like, the openings 5 are formed by wet etching. On the other hand, in a case where the insulating layer 4 is formed of a material, which cannot be chemically etched, such as an epoxy material or SiO group inorganic insulating material, the openings 5 are formed by dry etching using a plasma surface treatment technique. It should be noted that since an etchant, which etches the epoxy material or SiO group inorganic insulating material also etched other materials, such a material cannot be chemically etched virtually.

Figure 2F:
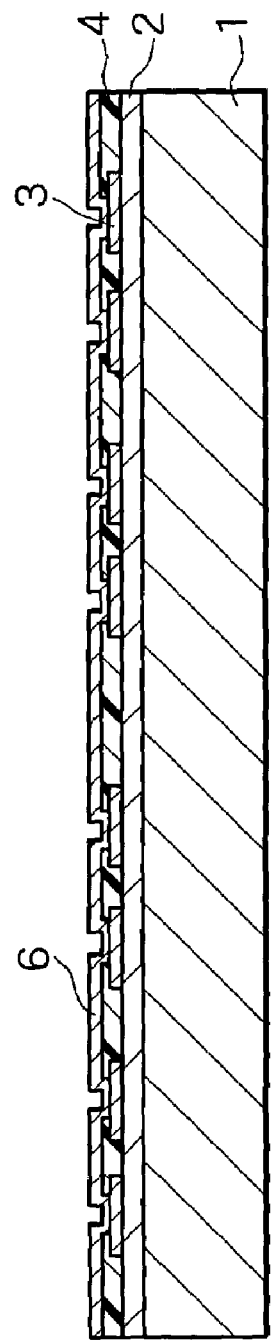

Then, as shown in FIG. 2F, Ti, Cr, Mo or W or their alloys be deposited on the entire surfaces of the external electrode pads 3 and the insulating layer 4 by a sputtering process or the like to form a thin film layer 6. That is, the thin film layer 6 is formed in the openings 5. This thin film layer 6 is formed for enhancing the adhesive properties between the external electrode pads 3 and wiring 7 (see FIG. 2G), which will be formed in the next step.

Figure 2G:
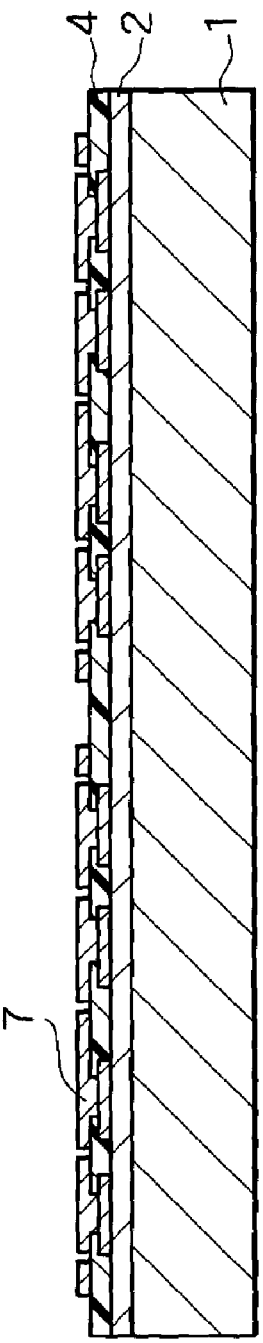

Subsequently, as shown in FIG. 2G, an electrode thin film (not shown) is formed to a thickness of for example 5 to 50 µm on the thin film layer 6 by a sputtering process, CVD process, electrolessly plating process or the like. The electrode thin film consists of an electrode material, that is Cu, Al or Ni. Then, a photoresist (not shown) is formed on the electrode thin film and the photoresist is subjected to exposure and development processes to pattern the photoresist. The electrode thin film and the thin film layer 6 are then etched by wet etching or dry etching using the patterned photoresist as a mask to selectively remove them whereby wiring 7 is formed. That is, the portions which were not etched in the thin film layer 6 and the electrode thin film become wiring 7. At this time the thickness of the wiring 7 is about 5 to 50 µm.

In this case, when the pattern pitches of the wiring 7 may be large, the wiring 7 may be formed by the following steps. That is a thin film layer 6 is formed on the entire surface of the insulating layer 4 and a photoresist is formed on this thin film layer 6. Then this photoresist is subjected to exposure and development processes to pattern, which is an inverted pattern of the wiring pattern of the wiring 7. Subsequently, Cu or the like is electrolytically plated so that wiring patterns are formed in the openings of the photoresist. Then, the photoresist is peeled and the thin film layer 6 are etched using the wiring patterns as a mask, whereby wiring 7 is formed.

Figure 3A:
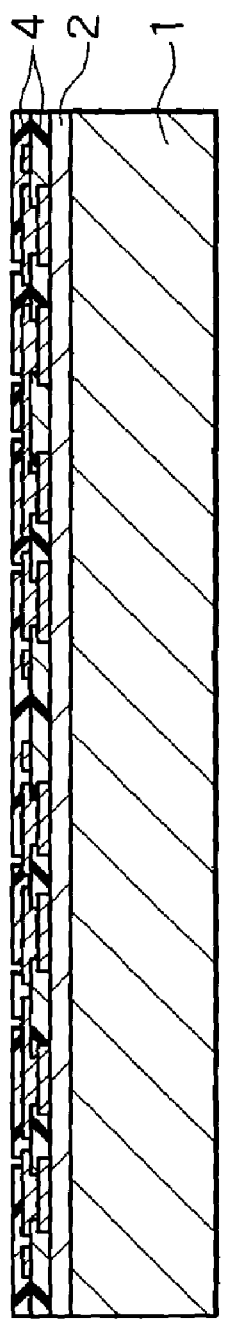
FIGS. 3A to 3F are cross-sectional views showing a method of manufacturing the semiconductor device according to the present embodiment in the order of the steps, showing the next step of FIG. 2G.
Figure 3B:
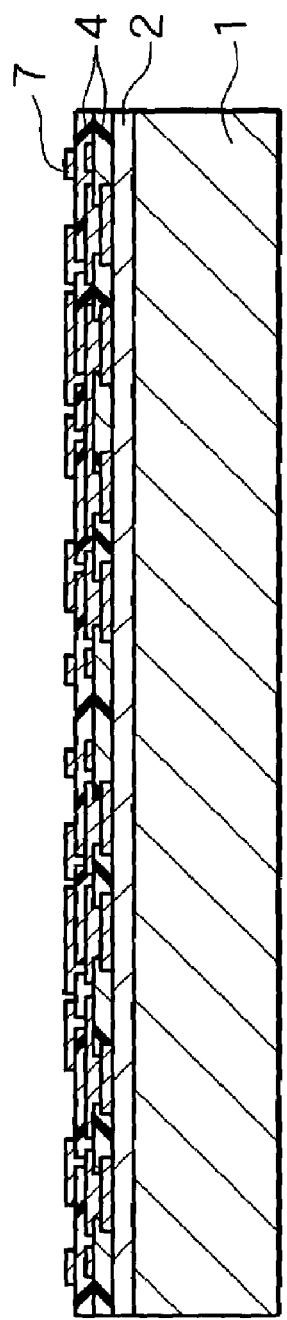
Figure 3C:
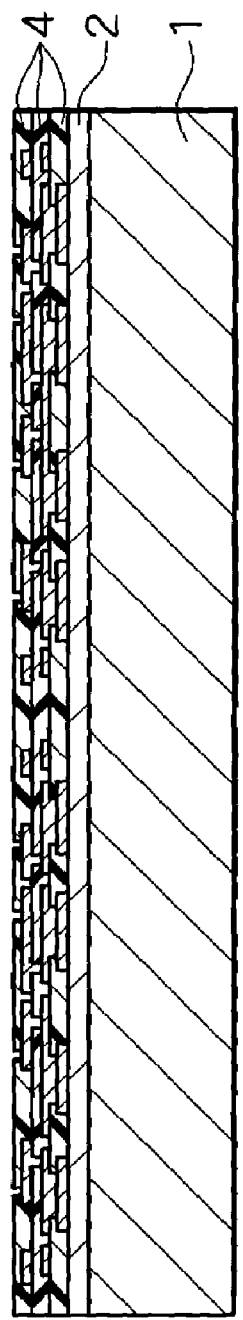
Figure 3D:
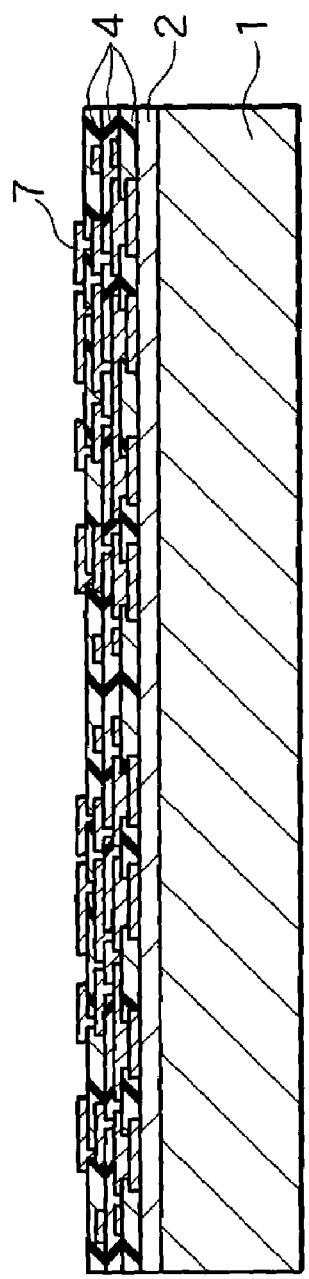
Figure 3E:
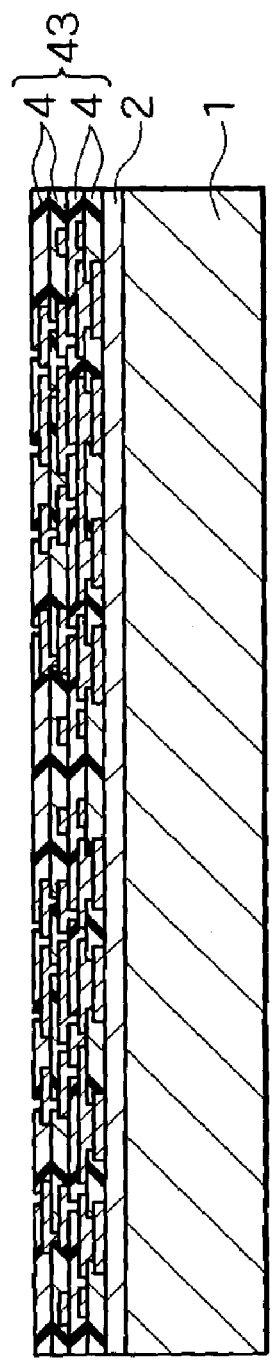

Then as shown in FIGS. 3A to 3E, the above-mentioned steps from the formation of the insulating layer 4 to the formation of the wiring 7, that is the steps shown in FIGS. 2D to 2G are repeated so that a wiring structure body 43 having a required multilayer wiring structure is formed. In this case, the insulating layer 4 is formed in such a manner that it covers the wiring 7 just below the insulating layer 4. The top layer of the wiring structure body 43 is formed to be the insulating layer 4. Therefore, the number of the insulating layer 4 becomes larger by one than the number of the wiring 7. In the present embodiment four insulating layers 4 and three wirings 7 are alternately formed as shown in FIG. 3E.

Figure 3F:
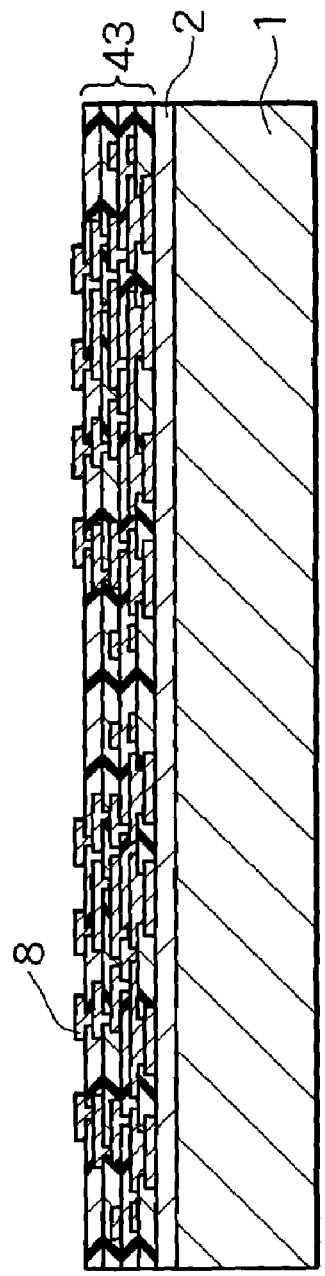

After the wiring structure body 43 was formed, pad electrodes 8 are formed on the top layer of the wiring structure body 43 by the use of a metal thin film wiring formation technique as shown in FIG. 3F. The pad electrodes 8 are formed at positions corresponding to bump electrode patterns of a flip-chip type semiconductor chip, which will be mounted at a later step, that is positions where the pad electrodes 8 are connected to the wiring 7 in the top layer of the wiring structure body 43. As the pad electrodes 8, for example, Au/Ni/Cu composite plated layer or a layer consisting of these alloys is used. At this time, in the Au/Ni/Cu composite plated layer, which forms the pad electrodes 8, the thickness of the Au layer is for example 0.3 to 3 µm, the thickness of the Ni layer is for example 1 to 10 µm, and the thickness of the Cu layer is for example 10 to 50 µm. Therefore, the total thickness of the pad electrodes 8 reaches 11.3 to 63 µm.

After that as shown in FIG. 4A, a solder resist film 9 is formed on the entire surfaces of the wiring structure body 43 and the pad electrodes 8 and openings are provided at areas just above the pad electrodes 8 in the solder resist film 9. In this case, the thickness of the solder resist film 9 is set to for example 10 to 60 µm. The solder resist film 9 protects the exposed portions of the wiring structure body 43 and the edge portions of the pad electrodes 8. The wiring structure body 43, the pad electrodes 8 and the solder resist film 9 form a multilayer wiring board 44.

When the solder resist film 9 is formed of a non-photosensitive material, a photoresist is coated on the solder resist film 9 and the photoresist is subjected to exposure and development processes to pattern. Then the solder resist film 9 is selectively removed by wet etching or dry etching using the patterned photoresist as a mask so that the openings in the solder resist film are formed. Further, when the solder resist film 9 is formed of a photosensitive material, the solder resist film 9 is subjected to exposure and development processes so that openings of the solder resist film may be formed without the formation of the photoresist. Further, when the reliability of the insulating layer 4 in the wiring structure body 43 on mechanical and chemical stresses is extremely high, it is not necessary to form a solder resist film 9.

As shown in FIG. 4A, the multilayer wiring board 44 is formed by laminating the external electrode pads 3, insulating layer 4, wiring 7, insulating layer 4, wring 7, insulating layer 4, wiring 7, insulating layer 4, pad electrodes 8, and solder resist film 9 in this order from the base substrate 1 side so that it has a metallic five-layer structure. The thickness of each layer comprising the multilayer wiring board 44 is as follows. That is, for example, the thickness of the external electrode pad 3 is about 11 to 63 µm, the thickness of a portion corresponding to an area just above the wiring 7 in the insulating layer 4 is about 20 to 80 µm, the thickness of the wiring 7 is about 5 to 50 µm, the thickness of the pad electrodes 8 is about 11 to 63 µm and the thickness of the solder resist film 9 is about 10 to 60 µm. Therefore, the entire thickness of the multilayer wiring board 44 in the present embodiment reaches about 127 to 656 µm.

Then, as shown in FIG. 4B, an insulating adhesive 10 is applied to parts of the surface of the solder resist film 9, which are positioned at the top layer of the multilayer wiring board 44. The insulating adhesive 10 is an adhesive consisting of, for example, epoxy type resins, or silicone type resins. Further, reinforcing plates 11, for reinforcing the multilayer wiring board 44, are adhered to required positions on the multilayer wiring board 44 thorough the insulating adhesive 10. The reinforcing plate 11 may be formed of stainless steel (SUS), or by Ni plating on a surface of the reinforcing plate body consisting of Cu.

Then, as shown in FIG. 4C, at least a part, for example, all of the etching-back layer 2 disposed on the base substrate 1 are removed by chemical wet etching. In this case, the etching is performed by such etching conditions that only the etching-back layer 2 is etched and the base substrate 1 and multilayer wiring board 44 are not substantially etched. Accordingly, as shown in FIG. 4D, the multilayer wiring board 44 and the base substrate 1 are separated from each other. In this case, when the etching-back layer 2 is formed of Al, it can be removed by use of alkaline water solution such as TMAH (tetra methyl ammonium hydroxide) water solution as etchant. Further, when the etching-back layer 2 is formed of Cu, cupric chloride type etchant or hydrolytic sulfate type etchant can be used.

It should be noted that in the step shown in FIG. 2C, when an intermediate layer (not shown) such as a Ti/Cu layer, a Cr/Cu alloy layer or a Cu alloy single layer or the like was formed on an etching-back layer 2 of Al, this intermediate layer is not removed in the steps shown in FIGS. 4C and 4D. Therefore, since an electric conductive intermediate layer is left under the external electrode pads 3, a step of removing this intermediate layer is needed by use of a dry etching technique such as an ion beam etching process or the like after the step shown in FIG. 4D.

After the etching-back layer 2 was removed to separate the multilayer wiring board 44 and the base substrate 1 from each other, electrical properties tests for the multilayer wiring board 44 itself can be performed. Thus, in the subsequent flip-chip mounting steps flip-chip type semiconductor chips can be mounted on portions in the multilayer wiring board 44, which were judged to be electrically good products. As a result, yields of the semiconductor device can be enhanced.

Figure 5A:
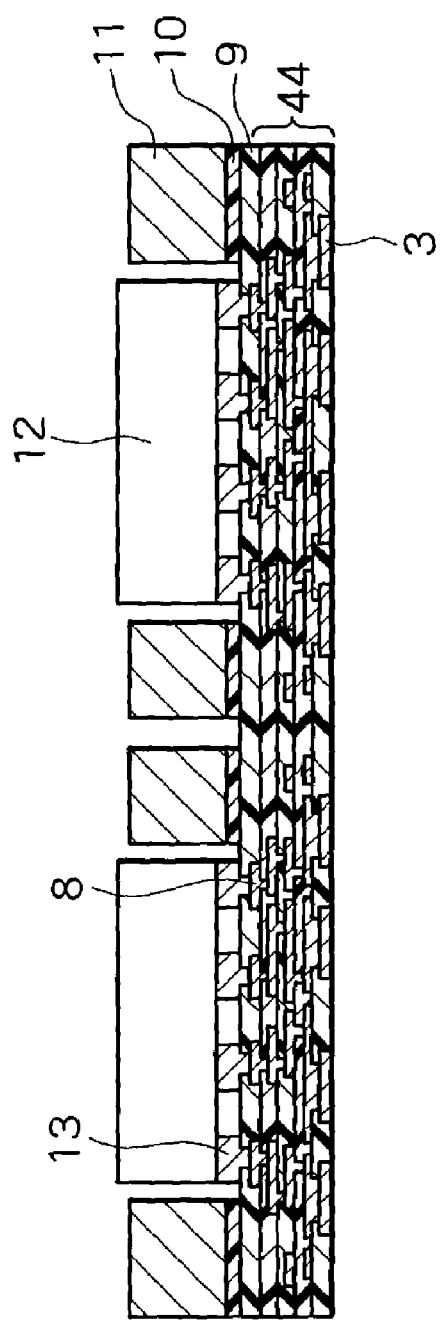

Then as shown in FIG. 5A, bump electrodes 13 of the flip-chip type semiconductor chip 12 are connected to pad electrodes 8 of the multilayer wiring board 44. Accordingly, semiconductor chips 12 are flip-chip mounted on regions where the reinforcing plates 11 are not provided on a surface of the pad electrode 8 side of the multilayer wiring board 44. At this time, if the bump electrodes 13 are solder using a metallic material such as Sn or Pb as the principal component, the flip-chip mounting can be performed in a heating reflow step using flux. Further, when the bump electrodes 13 are formed of a metallic material using Au, In or the like as the principal component, the flip-chip mounting by a thermocontact bonding process can be performed.

Figure 5B:
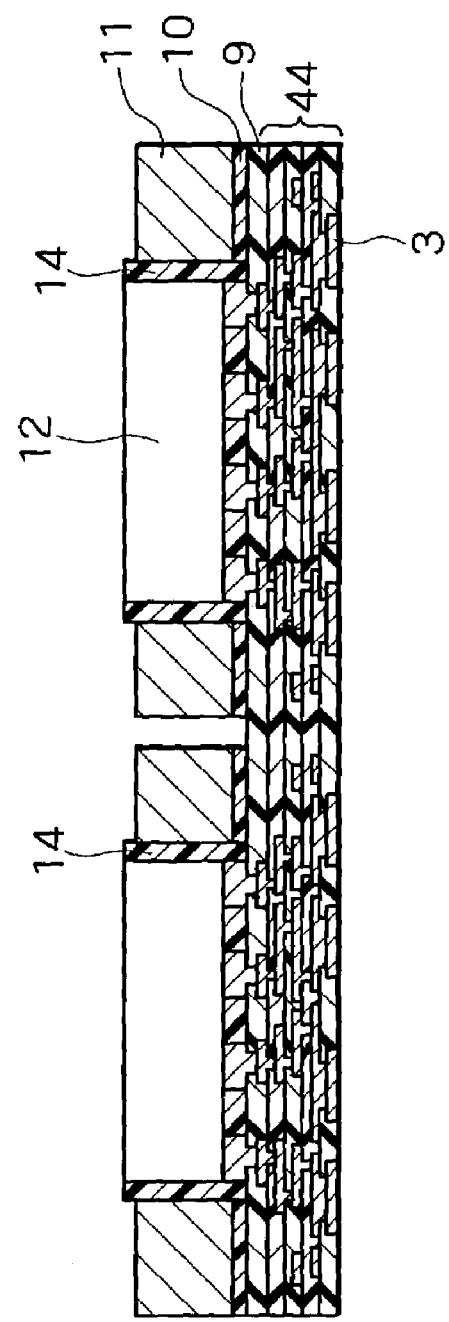

After that as shown in FIG. 5B, the side surfaces and bottom surfaces of the semiconductor chip 12, that is the portions between the semiconductor chip 12 and the reinforcing plate 11 and the portions between the semiconductor chip 12 and the multilayer wiring board 44, are sealed by an insulating sealing resin 14. In this case, as a sealing method of the insulating sealing resin 14, an injection resin injecting technique incorporating a vacuum sealing technique, a transfer sealing technique, or a sealing technique using a liquid underfill material or the like can be used. It is preferable that the insulating sealing resin 14 is formed of one or two or more resins selected from a group consisting of epoxy resin, silicone resin, polyimide resin, polyolefin resin, cyanate ester resin, phenol resin and naphthalene resin as the principal component.

Then, as shown in FIG. 5C, to the respective external electrode pads 3 in the multilayer wiring board 44 are attached solder balls 15 in which a metallic material such as Sn or the like is used as the principal of an external terminal. In this case, after flux was selectively applied to the external electrode pads 3, the solder balls 15 are mounted on the regions where the flux was supplied and heat treatment was performed by an IR reflow process, whereby the solder balls 15 could be attached to the external electrode pads 3.

After that as shown in FIG. 5D, the multilayer wiring board 44 is cut and separated for example every semiconductor chip 12 using a dicing blade or the like. Accordingly, by treating of the respective pieces of the flip-chip type semiconductor device, a flip-chip type semiconductor device 45 according to the present embodiment can be obtained.

Then, as shown in FIG. 5D, in the flip-chip type semiconductor device 45 according to the present embodiment, the multilayer wiring board 44 is provided. In this multilayer wiring board 44, external electrode pads 3, insulating layer 4, wiring 7, insulating layer 4, wiring 7, insulating layer 4, wiring 7, insulating layer 4, pad electrodes 8, solder resist film 9 are laminated in this order from the lower side, so that a metallic five layer structure is formed. As described above, the total thickness of the multilayer wiring board 44 in this embodiment is 127 to 656 μm. On the external electrode pads 3 on the lower surface of the multilayer wiring board 44 are mounted solder balls 15 consisting of for example Sn. Further, in a partial region of the upper surface of the multilayer wiring board 44 reinforcing plates 11 are connected to the solder resist film 9, and on a region of the upper surface of the multilayer wiring board 44 where the reinforcing plates 11 are not provided, for example one semiconductor chip 12 is mounted. The bump electrodes 13 in the semiconductor chip 12 are electrically connected to the pad electrodes 8 on the multilayer wiring board 44. Further, insulating sealing resin 14 is filled between the semiconductor chip 12 and the multilayer wiring board 44, and between the semiconductor chip 12 and the reinforcing plate 11 to seal the respective gaps therebetween. Then the flip-chip type semiconductor device 45 is mounted on a substrate (not shown) through the solder balls 15.

In the flip-chip type semiconductor device 45, electric power is supplied from a substrate (not shown) to the semiconductor chip 12 through the solder ball 15, external electrode pad 3, three-layer wiring 7, pad electrode 8 and bump electrode 13 and at the same time signals are input and output, whereby the semiconductor chip 12 is operated.

In the step shown in FIG. 4D according to the present embodiment, the base substrate 1 separated from the multilayer wiring board 44 is not subjected to any physical and chemical damage by alkaline water solution used as etchant, cupric chloride type etchant, hydrolytic sulfate type etchant. Therefore, the reuse of the base substrate 1 is possible. As a result the manufacturing cost of the semiconductor device can be reduced.

Further, in the steps of forming a wiring pattern of a multilayer wiring board in the present embodiment, to thickly form metallic thin film wiring about to 10 to 30 μm like a conventional built-up substrate is not necessarily needed, and a metallizing manufacturing process and a manufacturing device for semiconductor wafers can be utilized. Therefore, even if the thicknesses of a photoresist and a wiring layer are thinned to be 1 μm or less, processing treatment can be easily performed, whereby the fine patterning of a wiring pattern can be easily promoted. Thus, by promoting the fine patterning of a wiring pattern to provide an organic multilayer wiring board with high density and to decrease the size of an external shape of a multilayer wiring board itself become possible and the manufacturing cost can be significantly reduced.

Further, if a semiconductor wafer is used as a base substrate, each package can be produced by wafer-level processing treatment. Accordingly, the steps can be more drastically reduced as compared with a packaging process in which each package is manufactured from individual pieces and significant cost reduction becomes possible.

It is noted that in the present embodiment, an example having a metallic five layer structure as the multilayer wiring board 44 has been shown. However the present invention is not limited to the structure. Alternatively, the multilayer wiring board may be a metallic two-layer structure consisting of (external electrode pad/insulating layer/pad electrode/solder resist film). In this case, since the thickness of each layer is as mentioned above, the total thickness of the multilayer wiring board reaches for example 52 to 266 μm. Alternatively, the multilayer wiring board may be a metallic three-layer structure consisting of (external electrode pad/insulating layer/wiring layer/insulating layer/pad electrode/solder resist film). In this case, the total thickness of the multilayer wiring board reaches for example 77 to 396 μm. Alternatively, the multilayer wiring board may be a metallic four-layer structure consisting of (external electrode pad/insulating layer/wiring layer/insulating layer/wiring layer/insulating layer/pad electrode/solder resist film). In this case, the total thickness of the multilayer wiring board reaches for example 102 to 526 μm. Further, the multilayer wiring board may be a metallic six-layer structure consisting of (external electrode pad/insulating layer/wiring layer/insulating layer/wiring layer/insulating layer/wiring layer/insulating layer/pad electrode/solder resist film). In this case, the total thickness of the multilayer wiring board reaches for example 152 to 786 μm.

Figure 6:
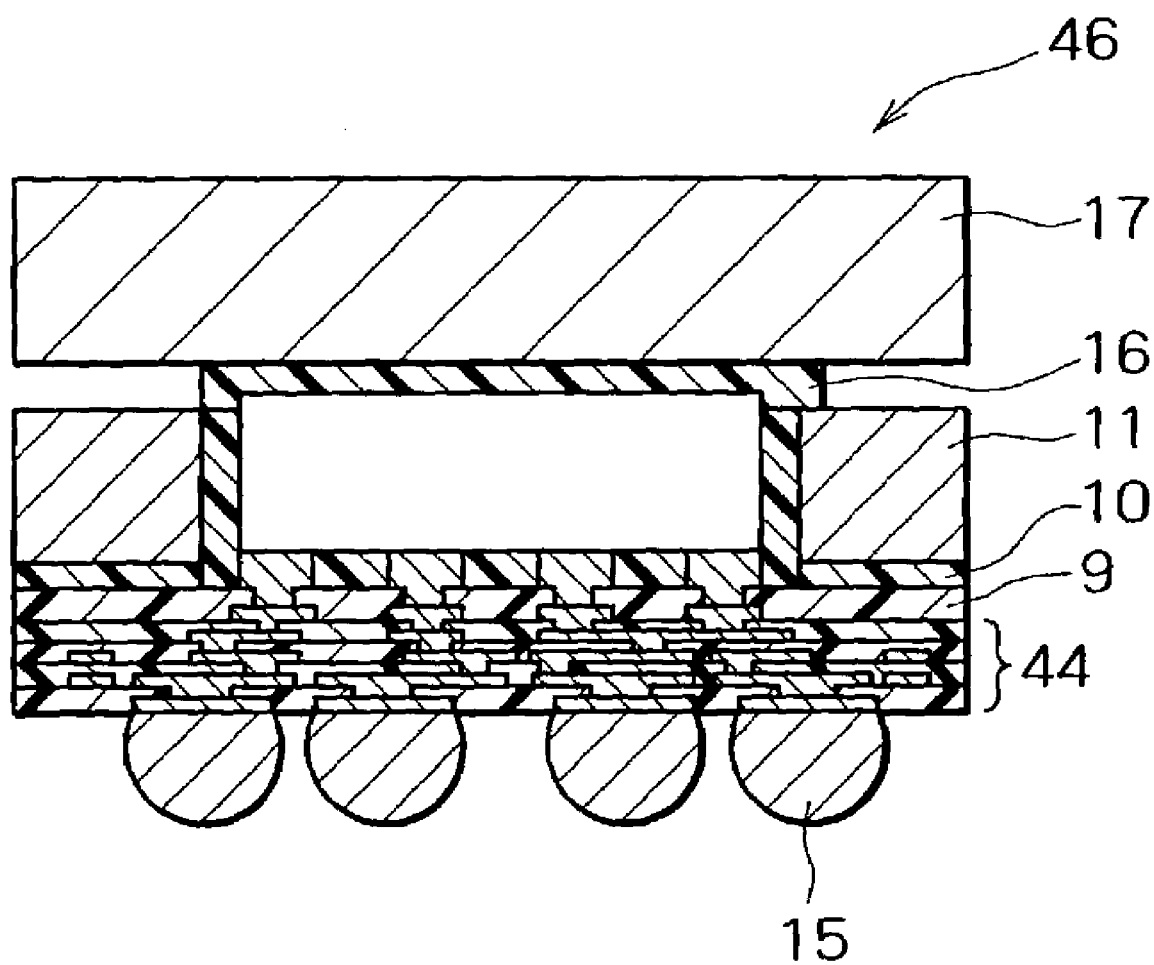
FIG. 6 is a cross-sectional view showing a flip-chip type semiconductor device according to a variation of the present embodiment.

Next, a variation of the present embodiment will be shown. FIG. 6 is a cross-sectional view showing a flip-chip type semiconductor device according to the variation. Flip-chip type semiconductor devices are generally often applied to multi-pin/high speed type Logic devices. In the application of such devices there occurs a problem how to spread heat generated in accordance with the operation of the semiconductor chip.

Accordingly, as shown in FIG. 6, in a flip-chip type semiconductor device 46 according to the variation, to enhance the heat spreading properties of the flip-chip type semiconductor device 45 of the present invention, onto the back surface of the semiconductor chip 12, that is, onto a surface of a side where bump electrodes 13 are not provided, in the flip-chip type semiconductor device produced by the first embodiment, an adhesive 16 having heat spreading properties is applied. Then a heat spreader 17 used as a heat spreading body is attached to the surface of the semiconductor chip 12 through the adhesive 16 having the heat spreading properties.

It should be noted that the heat spreader 17 is preferably formed of a metallic material using any one of Cu, Al, W, Mo, Fe, Ni and Cr as the principal component, or of a ceramic material using any one of alumina, AlN, SiC and mullite as the principal component.

Further, the adhesive 16 having heat spreading properties is preferably formed of any one of resins consisting of epoxy resins, silicone resins, polyimide resins, polyolefin resins, cyanate ester resins, phenol resins and naphthalene resins used as the principal component and formed of any one of materials consisting of Ag, Pd, Cu, Al, Au, Mo, W, diamond, alumina, AlN, mullite, BN and SiC. The configuration, operation and method of manufacturing other than those mentioned above in the present variation are the same as in the above described first embodiment.

As described above, the variation can enhance the spreading effect of the semiconductor device. The other effects other than the effects described above in the variation are the same as those of the first embodiment.

Figure 7:
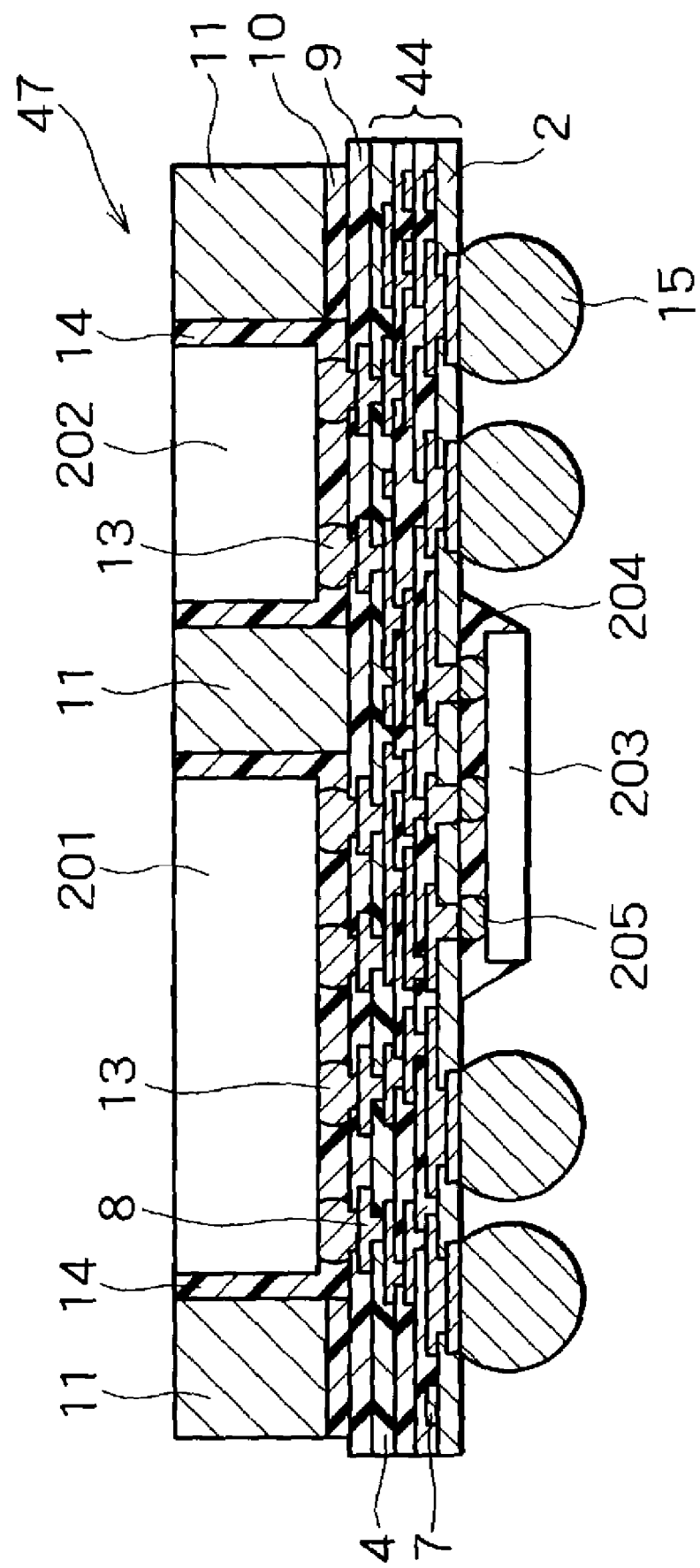
FIG. 7 is a cross-sectional view showing a flip-chip type semiconductor device according to another variation of the present embodiment.

Next, other variation of the present embodiment will be described. FIG. 7 is a cross-sectional view showing a flip-chip type semiconductor device according to the present variation. In the first embodiment described above, a single semiconductor chip 12-mounted flip chip type semiconductor device has been explained. However, in recent years a plurality of chips-mounted flip-chip type semiconductor device has been demanded because of the necessity of realizing functions that cannot be realized by the single semiconductor chip.

As shown in FIG. 7, in the flip-chip type semiconductor device 47 according to the present variation, an MPU chip 201 and a memory chip 202 are electrically connected to the surface of the multilayer wiring board 44 manufactured by the first embodiment through bump electrodes 13, and are sealed by insulating sealing resin 14. Further, an ASIC chip 203 is connected to the back surface of the multilayer wiring board 44 through solder balls 205 and is sealed by insulating sealing resin 204. The solder ball 205 is connected to the external electrode pad 3. Consequently, MPU chip 201, memory chip 202, and ASIC chip 203 are connected to each other through the bump electrodes 13, pad electrodes 8, wiring 7, external electrode pads 3 and solder balls 205, and are connected to the external portions through the solder balls 15. The configuration, operation and method of manufacturing other than those mentioned above in the present variation are the same as in the above described first embodiment.

As described above, according to the present variation, a system comprising a plurality of semiconductor chips can be realized in the flip-chip type semiconductor device. The effects other than the effects described above in the present variation are the same as those of the first embodiment mentioned above.

It is noted that in the present variation, ASIC chip 203 is disposed on a region between the solder balls 15 on the back surface of the multilayer wiring board 44. However, if there is a space for ASIC chip 203 on the front surface of the multilayer wiring board 44, it may be connected to the front surface thereof. Further, the above-mentioned heat spreader may be mounted on each of the semiconductor chips in the present variation.

Figure 8:
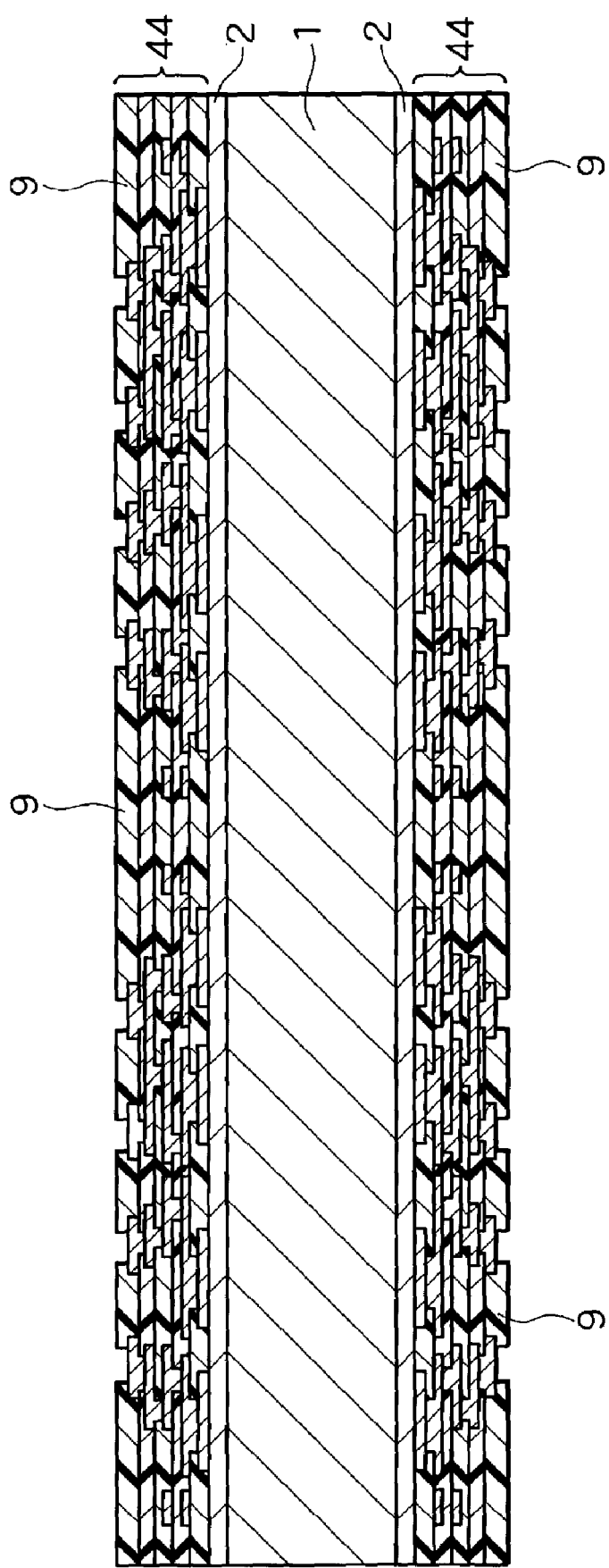
FIG. 8 is a cross-sectional view showing a semiconductor device according to a second embodiment of the present invention.

Next, a second embodiment of the present invention will be described. FIG. 8 is a cross-sectional view showing a semiconductor device according to the embodiment. In the above-mentioned first embodiment, the multilayer wiring board 44 was formed on only one side surface of the base substrate 1. However, the other side surface of the base substrate 1 is not substantially used. Thus, etching-back layers 2 are formed on both front and back surface of the base substrate 1 and multilayer wiring boards 44 can be respectively formed on the etching-back layers 2 formed on the both front and back surface of the base substrate 1. Note that since steps of forming the multilayer wiring boards 44 on both front and back surface of the base substrate 1 are substantially the same as in the first embodiment, the explanation of the steps is omitted for simplification.

As described above, in the present embodiment, the multilayer wiring board can be formed on both front and back surface of the base substrate and the throughput of the multilayer wiring board per the base substrate 1 becomes twice, which permits significant enhancement of the production efficiency. As a result cost reduction in manufacturing the semiconductor device and reduction in manufacturing time become possible. The effects in the present embodiment other than the effects mentioned above are the same as those of the first embodiment.

Figure 9:
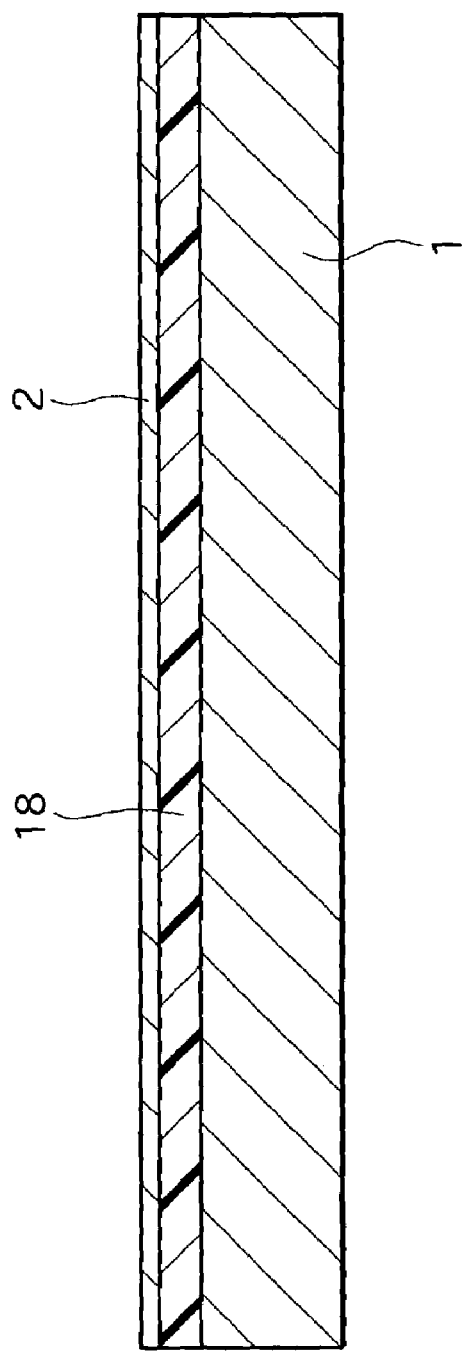
FIG. 9 is a cross-sectional view showing a method of manufacturing a semiconductor device according to a third embodiment of the present invention.

Next, a third embodiment of the present invention will be described. FIG. 9 is a cross-sectional view showing a method of manufacturing a semiconductor device according to the embodiment. As shown in FIG. 2B, in the above-mentioned first and second embodiments only one layer of the etching-back layer 2 is formed. Thus, in a step of etching the etching-back layer 2 shown in FIG. 4C, only the sides of the etching-back layer 2 make contact with etchant. Therefore, since the area in the etching-back layer 2 exposed by the etchant is small, etching-back time takes long time. Thus, the increase in etching-back time is not preferable because the throughput of manufacturing the multilayer wiring board is reduced. Therefore, to enhance the throughput thereof it is necessary to rapidly supply the etching-back layer 2 with etchant.

Accordingly, as shown in FIG. 9, a porous layer 18 having an excellent liquid-permeability is formed on a base substrate 1 in the present embodiment. The porous layer 18 is formed of for example porous polyimide. Then an etching-back layer 2 is formed on the porous layer 18. After that by the same steps as in the first embodiment shown in FIGS. 2C to 2G, FIGS. 3A to 3F, FIGS. 4A to 4D, and FIGS. 5A to 5D, a flip-chip type semiconductor device is formed. The method of manufacturing, configuration and operation other than those mentioned above in the present embodiments are the same as those of the first embodiment.

In this embodiment, in a step of etching-back the etching-back layer 2 to remove it by etchant (the step corresponds to a step shown in FIG. 4C in the first embodiment) after the step of forming the multilayer wiring board has been finished (the state corresponds to FIG. 4B in the first embodiment), the etchant is supplied not only to the sides of the etching-back layer 2 but also to a surface of the etching-back layer 2, which makes contact with a porous layer 18 through an inner hole of the porous layer 18. Thus, the etching speed of the etching-back layer 2 can be further increased as compared with a case where the porous layer 18 is not provided. In the present embodiment, by forming the porous layer 18 having an excellent liquid permeability on the base substrate 1 the etching speed of the etching-back layer 2 can be improved, whereby the throughput of the semiconductor device can be increased. The effects of the present embodiment other than the effects mentioned above are the same as those of the first embodiment.

It is noted that in the present embodiment the porous layer 18 was formed on the base substrate 1, but after an etching-back layer 2 was formed on the base substrate 1 a porous layer 18 may be formed on the etching-back layer 2. Alternatively, a sandwich structure of (a porous layer/an etching-back layer/a porous layer) may be formed on the base substrate 1. When such a sandwich structure is formed, the etching-back layer 2 is sandwiched by the porous layers 18 and etchant is supplied to both front and back surfaces of the etching-back layer 2. As a result, the etching-back layer 2 is more speedily etched by etchant. However, in the present embodiment, the porous layer 18 is formed in such a manner that it makes contact with the base substrate or the multilayer wiring board. Thus, after the etching-back layer is etched to be removed, a step of removing a remaining porous layer 18 is required.

Further, although in the present embodiment an example of providing a porous layer was explained to cause etchant to penetrate thereinto, if etchant can penetrate into materials at high speed, any materials other than the porous layer may be used.

Figure 10:
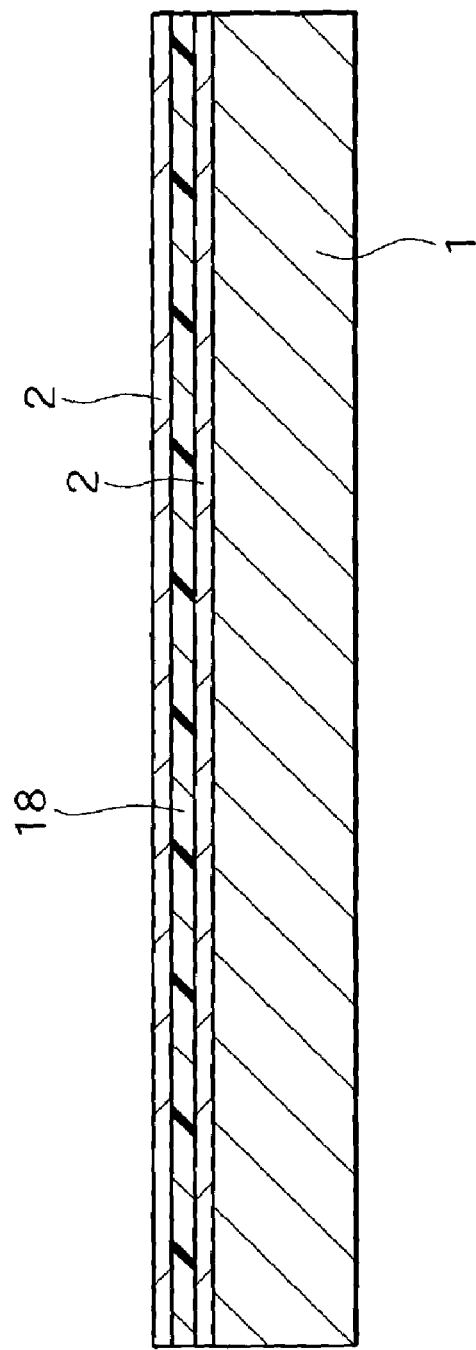
FIG. 10 is a cross-sectional view showing a method of manufacturing a semiconductor device according to a fourth embodiment of the present invention.

Next, a fourth embodiment of the present invention will be described. FIG. 10 is a cross-sectional view showing a method of manufacturing a semiconductor device according to the present embodiment. In the above-mentioned third embodiment, a method of enhancing the etching speed by providing the porous layer was explained. However, when the porous layer is formed on the base substrate, it is necessary to consider the adhesive properties between the porous layer and the base substrate and between the porous layer and the etching-back layer. Alternatively, when the porous layer is formed between the etching-back layer and the multilayer wiring board, it is necessary to consider the adhesive properties between the porous layer and the etching-back layer and between the porous layer and the multilayer wiring board.

Therefore, in the present embodiment, three layers structure is formed on a base substrate 1 to increase a degree of freedom of adhesive properties. That is, shown in FIG. 10, an etching-back layer 2 is formed on a base substrate 1, and a porous layer 18 having excellent liquid permeability is formed on the etching-back layer 2, and another etching-back layer 2 is further formed on the porous layer 18. Consequently, when the etching-back layer 2 is etched etchant is supplied to the etching-back layer 2 through the porous layer 18. The method of manufacturing, configuration and operation other than those mentioned above in the present embodiment are the same as those of the first embodiment mentioned above.

As described above, according to the present embodiment it is not necessary to consider the adhesive properties between the porous layer 18 and the multilayer wiring board and between the porous layer 18 and the base substrate 1 and only the consideration of the adhesive properties between the porous layer 18 and the etching-back layer 2 is required by sandwiching the porous layer 18 between the etching-back layers 2. Further, the porous layer 18 is sandwiched by the etching-back layers 2 and does not make contact with any one of the base substrate 1 and the multilayer wiring board. Accordingly, if the etching-back layers 2 are etched to be removed, the porous layer 18 is not left on the base substrate 1 and the multilayer wiring board. Therefore, it is not necessary to set a step of removing the porous layer 18 unlike the above-mentioned third embodiment. The effects other than those mentioned above in the present embodiment are the same as those of the above-mentioned third embodiment.

Next, a fifth embodiment of the present invention will be described. FIGS. 11A and 11B are cross-sectional views showing a method of manufacturing a semiconductor device according to the present embodiment in the order of the steps. The fifth embodiment is an improvement of the method of manufacturing the semiconductor device according to the above-mentioned first embodiment, and the steps shown in FIGS. 2A to 4A are quite the same steps as in the first embodiment. That is in the present embodiment an etching-back layer 2 is formed on a base substrate 1 by the use of steps shown in FIGS. 2A to 4A, and a multilayer wiring board 44 is formed on the etching-back layer 2.

Then, as shown in FIG. 11A, the etching-back layer 2 is etched to be removed and the base substrate 1 is separated from the multilayer wiring board 44. By theses steps a film of the multilayer wiring board 44 can be obtained. After that as shown in FIG. 11B, an insulating adhesive 10 is applied to the film of the multilayer wiring board 44. A reinforcing plate 11 of metal or alloy is then adhered to the multilayer wiring board 44 through this insulating adhesive 10. Then, by the same steps as in the first embodiment shown in FIGS. 5A to 5D a flip-chip type semiconductor device 45 (shown in FIG. 5D) is manufactured. The method of manufacturing, configuration, operation other than those mentioned above in the present embodiment are the same as those in the above-mentioned first embodiment.

Even in the present embodiment, a film of a multilayer wiring board 44 can be obtained and the film of the multilayer wiring board 44 can be easily applied to an installation for a manufacturing process using a film product of a typical TAB tape (Tape Automated Bonding Tape) as a carrying form. Thus, the multilayer wiring board 44 can be applied to a number of existing manufacturing installations associated with a substrate and merits occurs that reduction in a capital investment cost and the standardization of installation specification in the art can be easily promoted, resulting in obtaining effects of reduction in manufacturing cost.

Further, in the present embodiment the reuse of the base substrate is possible in steps of manufacturing the multilayer wiring board and the material cost in the manufacturing cost for the semiconductor devices can be remarkably reduced. Thus, a drastic low cost can be promoted.

Further, if etching-back layers are formed on both front and back surfaces of the base substrate like the above-mentioned second embodiment and multilayer wiring boards are formed on the etching-back layers, the throughput per one base substrate becomes twice and a remarkable improvement of the manufacturing efficiency becomes possible. As a result, a drastic reduction in the manufacturing cost for the semiconductor devices becomes possible.

What is claimed is:

1. A method of manufacturing a semiconductor device, comprising the steps of:
   forming an etching-back layer formed of a second material on a supporting substrate formed of a first material, said second material being different in etching rate from said first material;
   forming a multilayer wiring board on said etching-back layer;
   etching said etching-back layer to separate said supporting substrate from said multilayer wiring board;
   mounting a semiconductor chip on said multilayer wiring board; and
   forming an intermediate layer on said etching-back layer between the steps of forming said etching-back layer and forming said multilayer wiring board, so that said multilayer wiring board is laminated on said etching-back layer, wherein said intermediate layer is etched with the etching of said etching-back layer.

2. The method of manufacturing a semiconductor device according to claim 1, wherein said second material is Al, Al alloy, Cu, or Cu alloy.

3. The method of manufacturing a semiconductor device according to claim 1, wherein the step of forming said multilayer wiring board comprises the steps of:
   forming an outer electrode pad on said etching-back layer;
   forming an insulating layer so as to bury the outer electrode pad;
   forming an opening at at least a part of the insulating layer just above said outer electrode pad; and
   forming an inner electrode pad connected to said outer electrode pad through said opening on said insulating layer.

4. The method of manufacturing a semiconductor device according to claim 3, wherein the step of forming said multilayer wiring board further comprises the step of forming one or a plurality of wiring layer, the step of forming each of wiring layer comprises the steps of:
   forming wiring connected to said outer electrode pad through said opening on said insulating layer;
   forming another insulating layer so as to burry said wiring; and
   forming another opening at a part of said another insulating layer just above said wiring, said inner electrode pad being formed on said another insulating layer and connected to said wiring through said another opening.

5. The method of manufacturing a semiconductor device according to claim 1, further comprising a step of attaching a reinforcing plate for reinforcing said multilayer wiring board.

6. The method of manufacturing a semiconductor device according to claim 5, wherein the attachment of said reinforcing plate is carried out before said etching, and said reinforcing plate is attached to an opposite surface of said multilayer wiring board to the surface on said etching-back layer side.

7. The method of manufacturing a semiconductor device according to claim 5, wherein the attachment of said reinforcing plate is carried out after said etching.

8. The method of manufacturing a semiconductor device according to claim 1, wherein said etching-back layer is etched by wet etching in the step of etching said etching-back layer.

9. The method of manufacturing a semiconductor device according to claim 8, wherein said first material is a material, which is not substantially etched by etchant used in said etching step.

10. The method of manufacturing a semiconductor device according to claim 9, wherein said first material is a kind of metal or alloy selected from a group consisting of Si, Ti alloy, stainless steel, duralumin, and malaging steel.

11. The method of manufacturing a semiconductor device according to claim 9, wherein said first material is a kind of inorganic ceramic material selected from a group consisting of alumina, mullite, and aluminum nitride.

12. The method of manufacturing a semiconductor device according to claim 9, wherein said first material is polyimide.

13. The method of manufacturing a semiconductor device according to claim 8, wherein the surface on said etching-back layer side of said multilayer wiring board is formed of a material, which is not substantially etched with etchant used in said etching step.

14. A method of manufacturing a semiconductor device, comprising the steps of:
   forming an etching-back layer formed of a second material on a supporting substrate formed of a first material, said second material being different in etching rate from said first material;
   forming a multilayer wiring board on said etching-back layer;
   etching said etching-back layer to separate said supporting substrate from said multilayer wiring board;
   mounting a semiconductor chip on said multilayer wiring board; and forming a penetrating layer having higher liquid-permeability than that of said etching-back layer, on said etching-back layer between the steps of forming said etching-back layer and forming said multilayer wiring board.

15. The method of manufacturing a semiconductor device according to claim 14, further comprising a step of forming another etching-back layer formed of said second material on said penetrating layer between the steps of forming said penetrating layer and forming said multilayer wiring board.

16. The method of manufacturing a semiconductor device according to claim 14, wherein said penetrating layer is formed of a porous material.

17. A method of manufacturing a semiconductor device, comprising the steps of:
    forming an etching-back layer formed of a second material on a supporting substrate formed of a first material, said second material being different in etching rate from said first material;
    forming a multilayer wiring board on said etching-back layer;
    etching said etching-back layer by wet etching to separate said supporting substrate from said multilayer wiring board;
    mounting a semiconductor chip on said multilayer wiring board; and
    forming a penetrating layer having higher liquid-permeability than that of said etching-back layer on said supporting substrate before the step of forming said etching-back layer.

18. A method of manufacturing a semiconductor device, comprising the steps of:
    forming an etching-back layer formed of a second material on a supporting substrate formed of a first material, said second material being different in etching rate from said first material;
    forming a multilayer wiring board on said etching-back layer;
    etching said etching-back layer by wet etching to separate said supporting substrate from said muhilayer wiring board; and
    mounting a semiconductor chip on said multilayer wiring board, wherein said etching-back layer is formed on each of both front and back surfaces of said supporting substrate, and said multilayer wiring board is formed on each of said etching-back layers formed on the both front and back surfaces of said supporting substrate, and said etching-back layers formed on the both front and back surfaces of said supporting substrate are etched together in said step of etching.

19. A method of manufacturing a semiconductor device comprising the steps of:
    forming an etching-back layer formed of a second material on a supporting substrate formed of a first material, said second material being different in etching rate from said first material;
    forming a multilayer wiring board on said etching-back layer;
    etching said etching-back layer to separate said supporting substrate from said multilayer wiring board;
    mounting a plurality of semiconductor chips on said multilayer wiring board;
    separating said multilayer wiring board between every said semiconductor chip; and
    forming an intermediate layer on said etching-back layer between the steps of forming said etching-back layer and forming said multilayer wiring board, so that said multilayer wiring board is laminated on said etching-back layer, wherein said intermediate layer is etched with the etching of said etching-back layer.

* * * * *